(12) United States Patent
Lai et al.

(10) Patent No.: US 10,826,320 B2
(45) Date of Patent: Nov. 3, 2020

(54) SOLAR POWER SYSTEM

(71) Applicants: Austin Lai, Taichung (TW); Kai-Yang Cheng, Taichung (TW); Wei-Fu Hsu, Taichung (TW); Kuan-Ching Lee, Taichung (TW); Hui-Ping Yang, Taichung (TW)

(72) Inventors: Austin Lai, Taichung (TW); Kai-Yang Cheng, Taichung (TW); Wei-Fu Hsu, Taichung (TW); Kuan-Ching Lee, Taichung (TW); Hui-Ping Yang, Taichung (TW)

( * ) Notice: Subject to any disclaimer, the term of this patent is extended or adjusted under 35 U.S.C. 154(b) by 105 days.

(21) Appl. No.: 16/272,792

(22) Filed: Feb. 11, 2019

(65) Prior Publication Data

US 2020/0259362 A1  Aug. 13, 2020

(51) Int. Cl.
*H02J 7/35* (2006.01)
*H02S 40/38* (2014.01)
*H02M 7/44* (2006.01)
*G01R 19/165* (2006.01)
*H02J 7/00* (2006.01)

(52) U.S. Cl.
CPC .......... *H02J 7/35* (2013.01); *G01R 19/16542* (2013.01); *H02J 7/007* (2013.01); *H02M 7/44* (2013.01); *H02S 40/38* (2014.12)

(58) Field of Classification Search
CPC ....................................................... H02J 7/35

USPC ......................................................... 320/101
See application file for complete search history.

(56) References Cited

U.S. PATENT DOCUMENTS

| 3,928,791 | A | * | 12/1975 | Mullersman | ............... | H02J 7/34 320/119 |
| 4,602,694 | A | * | 7/1986 | Weldin | ................... | B60K 25/08 180/2.2 |
| 2008/0143292 | A1 | * | 6/2008 | Ward | ...................... | B60L 58/15 320/101 |
| 2016/0176305 | A1 | * | 6/2016 | James | ............... | H02M 3/33584 307/26 |

* cited by examiner

*Primary Examiner* — Jerry D Robbins
(74) *Attorney, Agent, or Firm* — Che-Yang Chen; Law Office of Michael Chen

(57) ABSTRACT

A solar power system may comprise a solar panel set, a controller, a lithium battery set, and at least a DC load. The controller has a control unit built therein to control a double-contact relay, a single-contact relay, and a transformer. The rated voltage of the solar panel set is higher than the rated voltage of the lithium battery set between 115% and 130%. When the actual voltage of the solar panel set is lower than 115% of the rated voltage of the lithium battery set, the solar panel set is configured to low-loss charge the lithium battery set under the low illumination condition. When the actual voltage of the solar panel set is higher than 115% of the rated voltage of the lithium battery set, the solar panel set under the high illumination condition is adapted to have voltage-drop through the transformer and high-efficiently charge the lithium battery set.

8 Claims, 5 Drawing Sheets

SOLAR POWER SYSTEM

FIELD OF THE INVENTION

The present invention relates to a solar power system and more particularly to a high-efficient solar power system with functions of auto wake-up under low-potential and low illumination conditions.

BACKGROUND OF THE INVENTION

Generally, due to the non-fixed voltage of sunshine power generation, the battery of the conventional solar power system is prone to damage when directly charged. Also, the battery of the solar power system only can be charged when the output voltage of the solar panel set is higher than the current voltage of the battery. Thus, the conventional solar power system is usually electrically connected to a MPPT (maximum power point tracking) controller to optimize the charging and discharging system of the solar power system. The MPPT controller is configured to have real-time monitoring to the output voltage of the solar panel set and to track the maximum power voltage and maximum power current of the solar power system.

However, the conventional solar power system is still disadvantageous, because: the operation voltage of the MPPT controller has to be over DC 100V such that, generally, the solar panels are electrically connected in series to increase the voltage. Through the MPPT controller, the solar power system is configured to generate electricity at maximum power, and the battery can only be charged after voltage drop, which results in power losses due to voltage rise and drop. Moreover, when the solar power system works under high-illumination environment, the power provided by the MPPT controller is higher than the power loss from voltage drop, but when the solar power system works under low-illumination environment, a small amount of power generated by the solar power system will be totally lost when voltage drop, which makes the solar power system to be only available under high-illumination environment. Also, when the solar panels is often under low-illumination, the battery is not only easy to have over-discharged but also be not awakened by the over-discharging protection mechanism due to self-discharging of the battery. Therefore, there remains a need for a new and improved design for a solar power system to overcome the problems presented above.

SUMMARY OF THE INVENTION

The present invention provides a solar power system which comprises a solar panel set, a controller, a lithium battery set, and at least a DC load. The solar panel set is electrically connected to a directly-charging circuit, a regulating charging circuit, and a control circuit. The controller has a control unit built therein to control a double-contact relay, a single-contact relay, and a transformer. The double-contact relay comprises a main contact, a first contact, and a second contact, and the main contact is switchable to electrically connect to the first contact or the second contact. The directly-charging circuit is electrically connected to the first contact, and the regulating charging circuit is electrically connected to the second contact through the transformer. The control circuit is electrically connected to the control unit, and the single-contact relay is electrically connected to a third contact and a fourth contact under normal use condition. The third contact is electrically connected to the main contact of the double-contact relay. The lithium battery set is electrically connected to the fourth contact of the single-contact relay, and the lithium battery set is electrically connected to the control unit through a monitoring circuit. At least one DC load is electrically connected to the third contact of the single-contact circuit.

In one embodiment, an inverter, which is electrically connected to the third contact of the single-contact relay, is adapted to convert direct current (DC) from the lithium battery set to alternating current (AC), and the inverter is electrically connected to at least an AC load, and the lithium battery set is adapted to provide alternating current to the AC load.

In another embodiment, the inverter is electrically connected to a mains electric power; when the main contact of the double-contact relay is not electrically connected to the first contact or the second contact, the mains electric power is configured to have voltage regulation and directly charge the lithium battery set.

In still another embodiment, the control unit of the controller is configured to monitor the actual voltage of the lithium battery set through the monitoring circuit; the lithium battery set is determined as under overcharged condition when the actual voltage thereof is higher than 115% of the rated voltage, wherein, under overcharged condition, the main contact of the double-contact relay is not electrically connect to the first contact or the second contact, and the lithium battery set is configured to directly provide power to the DC load.

In a further embodiment, high-potential protection mechanism of the lithium battery set is activated when the main contact of the double-contact relay is not electrically connect to the first contact or the second contact, and the solar power system is set through the controller and the control circuit that, under the high-potential protection status, the control unit is configured to electrically connect the second contact to the main contact every thirty minutes so as to enable the lithium battery set to awake the double-contact relay when not under overcharged condition.

In still a further embodiment, the control unit of the controller is configured to monitor the actual voltage of the lithium battery set through the monitoring circuit; the lithium battery set is determined as under over-discharged condition when the actual voltage thereof is lower than 96% of the rated voltage, and the third contact of the single-contact relay is electrically disconnected to the fourth contact thereof so as to activate the low-potential protection mechanism for the lithium battery set.

In yet a further embodiment, when the lithium battery set is under the low-potential protection status, the main contact of the double-contact relay is electrically connected to the first contact thereof, and the solar panel set monitored by the control unit is configured to execute the low illumination power generation; the control unit is adapted to electrically connect the third contact to the fourth contact of the single-contact relay so as to enable the single-contact relay to be awaked at the low illumination condition, thereby directly charging the lithium battery set.

In a particular embodiment, the rated voltage of the lithium battery set is 48V, and the solar panel set comprises four 54.7V solar panels electrically connected in parallel to form 60V of rated voltage under condition of no load voltage, and the actual voltage outputted from the directly-charging circuit of the solar panel set is between 46.1V and 55.2V while the actual voltage outputted from the regulating charging circuit of the solar panel set is between 55.2V and 60V.

Comparing with conventional solar power system, the present invention is advantageous because: when the actual voltage of the solar panel set is lower than 115% of the rated voltage of the lithium battery set, the first contact and the main contact of the double-contact relay are electrically connected, and the directly-charging circuit of the solar panel set is configured to directly and low-loss charge the lithium battery set under the low illumination condition so as to achieve the functions of awaking and a small amount of charging by the solar panel set and enhance the charging efficiency under the low illumination condition. When the actual voltage of the solar panel set is higher than 115% of the rated voltage of the lithium battery set, the second contact and the main contact of the double-contact relay are electrically connected, and the solar panel set under the high illumination condition is adapted to have voltage-drop through the transformer and directly and high-efficiently charge the lithium battery set.

DETAILED DESCRIPTION OF THE INVENTION

The detailed description set forth below is intended as a description of the presently exemplary device provided in accordance with aspects of the present invention and is not intended to represent the only forms in which the present invention may be prepared or utilized. It is to be understood, rather, that the same or equivalent functions and components may be accomplished by different embodiments that are also intended to be encompassed within the spirit and scope of the invention.

Unless defined otherwise, all technical and scientific terms used herein have the same meaning as commonly understood to one of ordinary skill in the art to which this invention belongs. Although any methods, devices and materials similar or equivalent to those described can be used in the practice or testing of the invention, the exemplary methods, devices and materials are now described.

All publications mentioned are incorporated by reference for the purpose of describing and disclosing, for example, the designs and methodologies that are described in the publications that might be used in connection with the presently described invention. The publications listed or discussed above, below and throughout the text are provided solely for their disclosure prior to the filing date of the present application. Nothing herein is to be construed as an admission that the inventors are not entitled to antedate such disclosure by virtue of prior invention.

Figure 1:
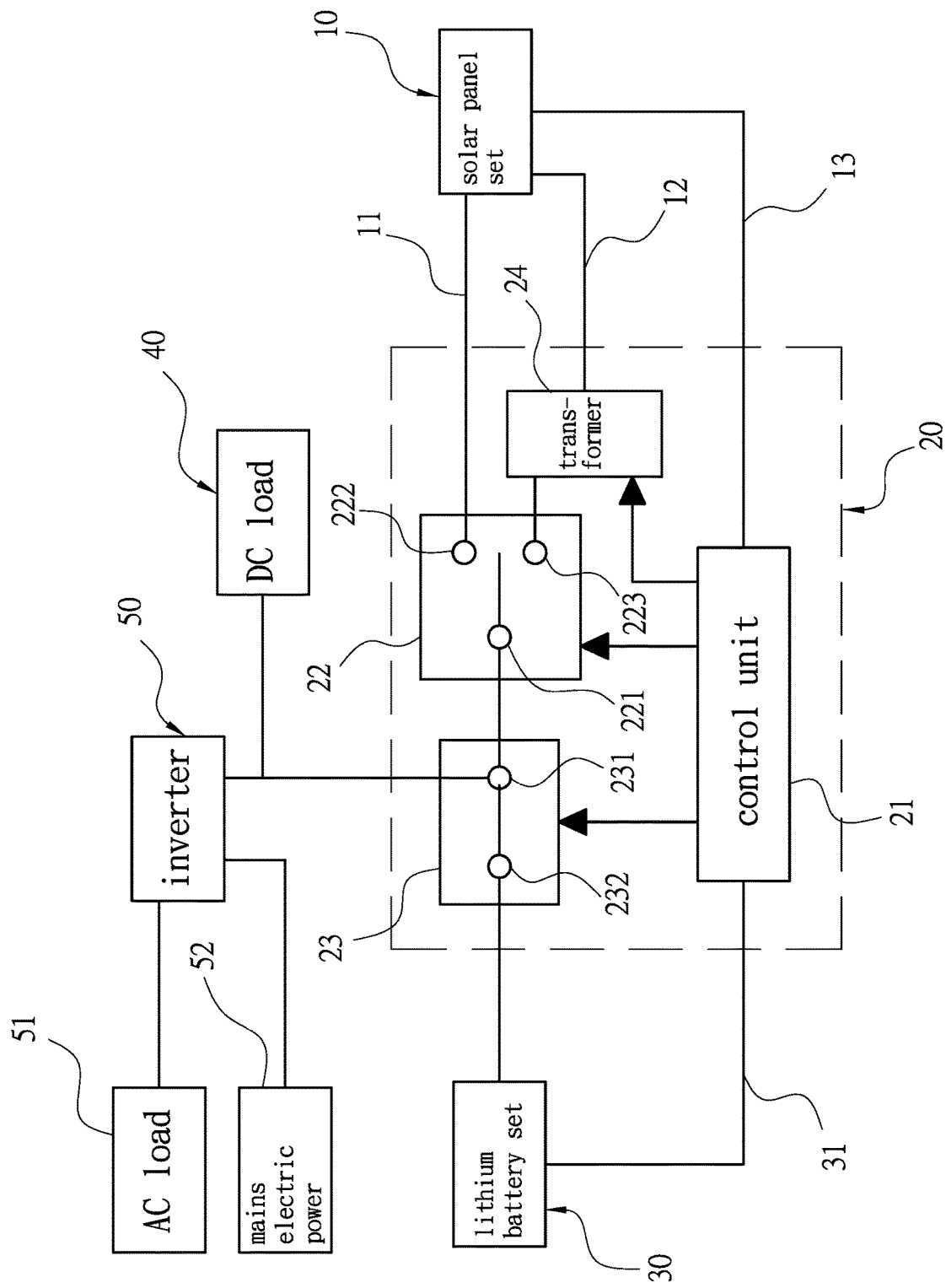
FIG. 1 is a flow block diagram of a solar power system of the present invention.
Figure 2:
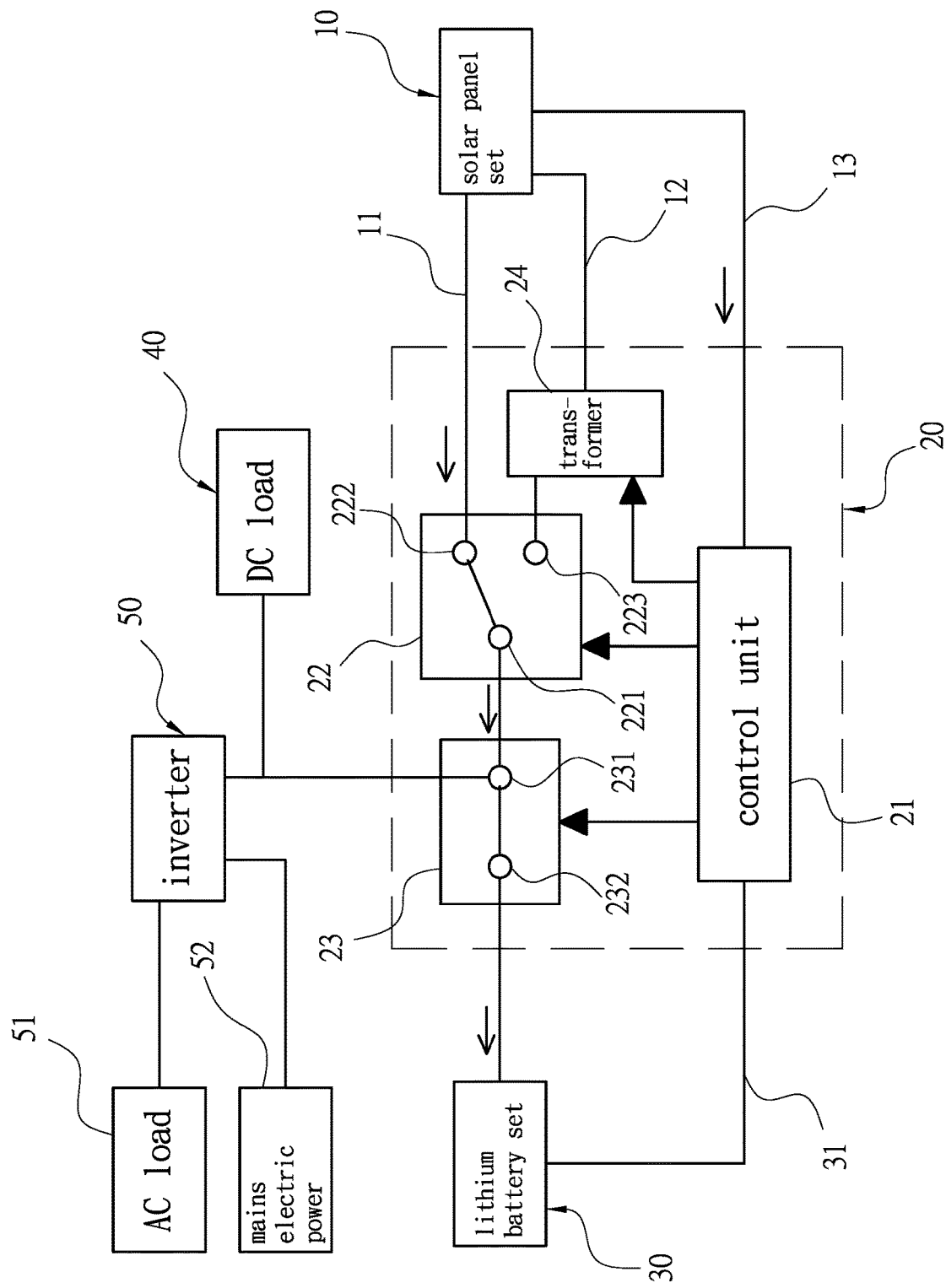
FIG. 2 is a flow block diagram of the solar power system of the present invention under directly charging mode.
Figure 3:
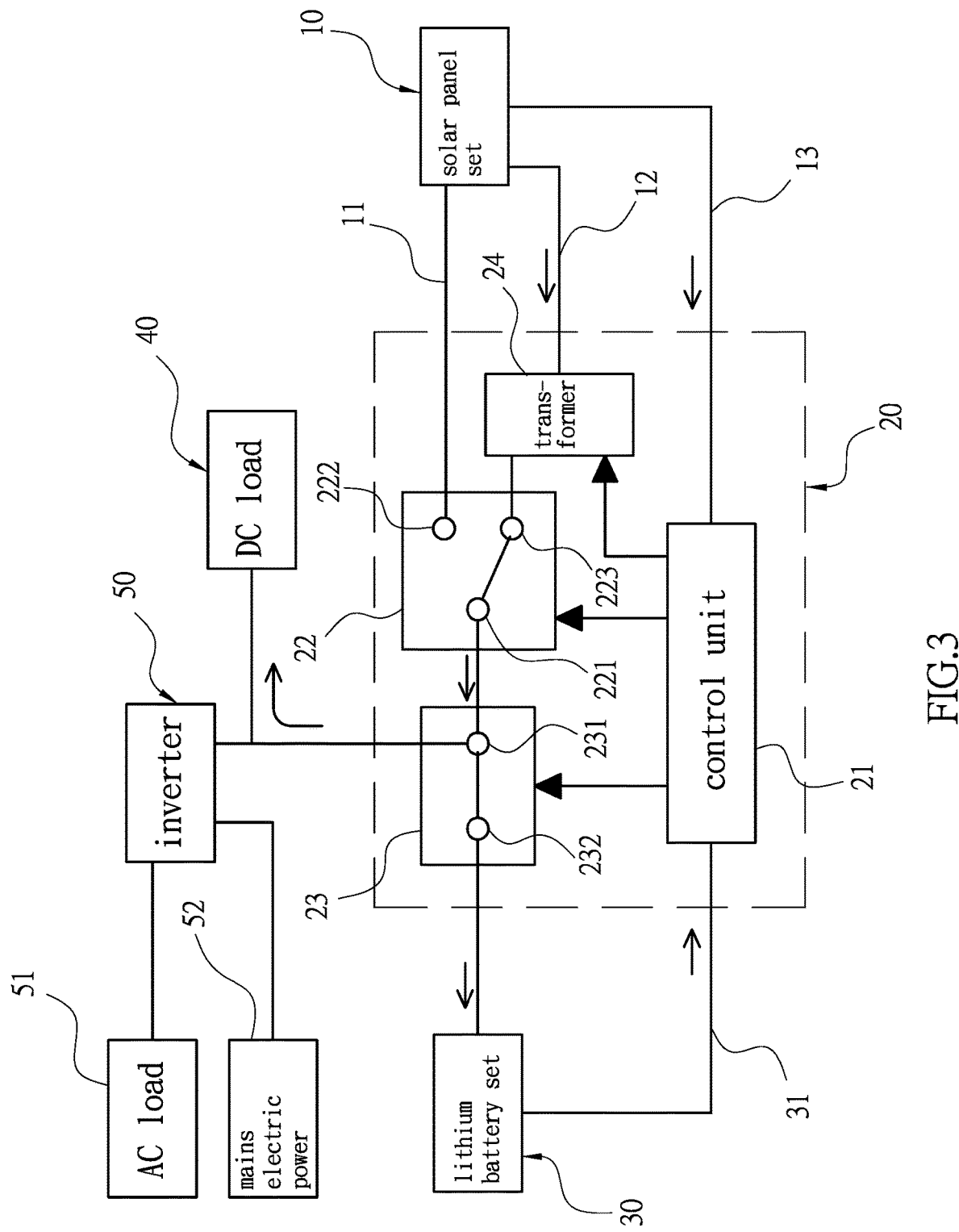
FIG. 3 is a flow block diagram of the solar power system of the present invention under regulating charging mode.

In order to further understand the goal, characteristics and effect of the present invention, a number of embodiments along with the drawings are illustrated as following:

Referring to FIGS. 1 to 3, the present invention provides a solar power system which comprises a solar panel set (10), a controller (20), a lithium battery set (30), at least a DC load (40), and an inverter (50). The solar panel set (10) is electrically connected to a directly-charging circuit (11), a regulating charging circuit (12), and a control circuit (13). The controller (20) has a control unit (21) built therein to control a double-contact relay (22), a single-contact relay (23), and a transformer (24). The double-contact relay (22) comprises a main contact (221), a first contact (222), and a second contact (223), and the main contact (221) is switchable to electrically connect to the first contact (222) or the second contact (223). The directly-charging circuit (11) is electrically connected to the first contact (222), and the regulating charging circuit (12) is electrically connected to the second contact (223) through the transformer (24). The control circuit (13) is electrically connected to the control unit (21), and the single-contact relay (23) is electrically connected to a third contact (231) and a fourth contact (232) under normal use condition. The third contact (231) is electrically connected to the main contact (221) of the double-contact relay (22). The lithium battery set (30) is electrically connected to the fourth contact (232) of the single-contact relay (23), and the lithium battery set (30) is electrically connected to the control unit (21) through a monitoring circuit (31). At least one DC load (40) is electrically connected to the third contact (231) of the single-contact circuit (23). The inverter (50), which is electrically connected to the third contact (231) of the single-contact relay (23), is adapted to convert direct current (DC) from the lithium battery set (30) to alternating current (AC), and the inverter (50) is electrically connected to at least an AC load (51). The lithium battery set (30) is adapted to provide alternating current to the AC load (51). Moreover, the inverter (50) is electrically connected to a mains electric power (52). When the main contact (221) of the double-contact relay (22) is not electrically connected to the first contact (222) or the second contact (223), the mains electric power (52) is configured to have voltage regulation and directly charge the lithium battery set (30) or to provide power to the DC load (40) and AC load (51). The rated voltage of the solar panel set (10) is higher than the rated voltage of the lithium battery set (30) between 15% and 30%, and the actual voltages of the solar panel set (10) and the lithium battery set (30) are measured through the control unit (21). When the actual voltage of the solar panel set (10) is lower than 115% of the rated voltage of the lithium battery set (30), the first contact (222) and the main contact (221) of the double-contact relay (22) are electrically connected, and the directly-charging circuit (11) of the solar panel set (10) is configured to directly and low-loss charge the lithium battery set (30) under the low illumination condition so as to achieve the functions of awaking and a small amount of charging by the solar panel set (10) and enhance the charging efficiency under the low illumination condition. When the actual voltage of the solar panel set (10) is higher than 115% of the rated voltage of the lithium battery set (30), the second contact (223) and the main contact (221) of the double-contact relay (22) are electrically connected, and the solar panel set (10) under the high illumination condition is adapted to have voltage-drop through the transformer (24) and directly and high-efficiently charge the lithium battery set (30).

Figure 4:
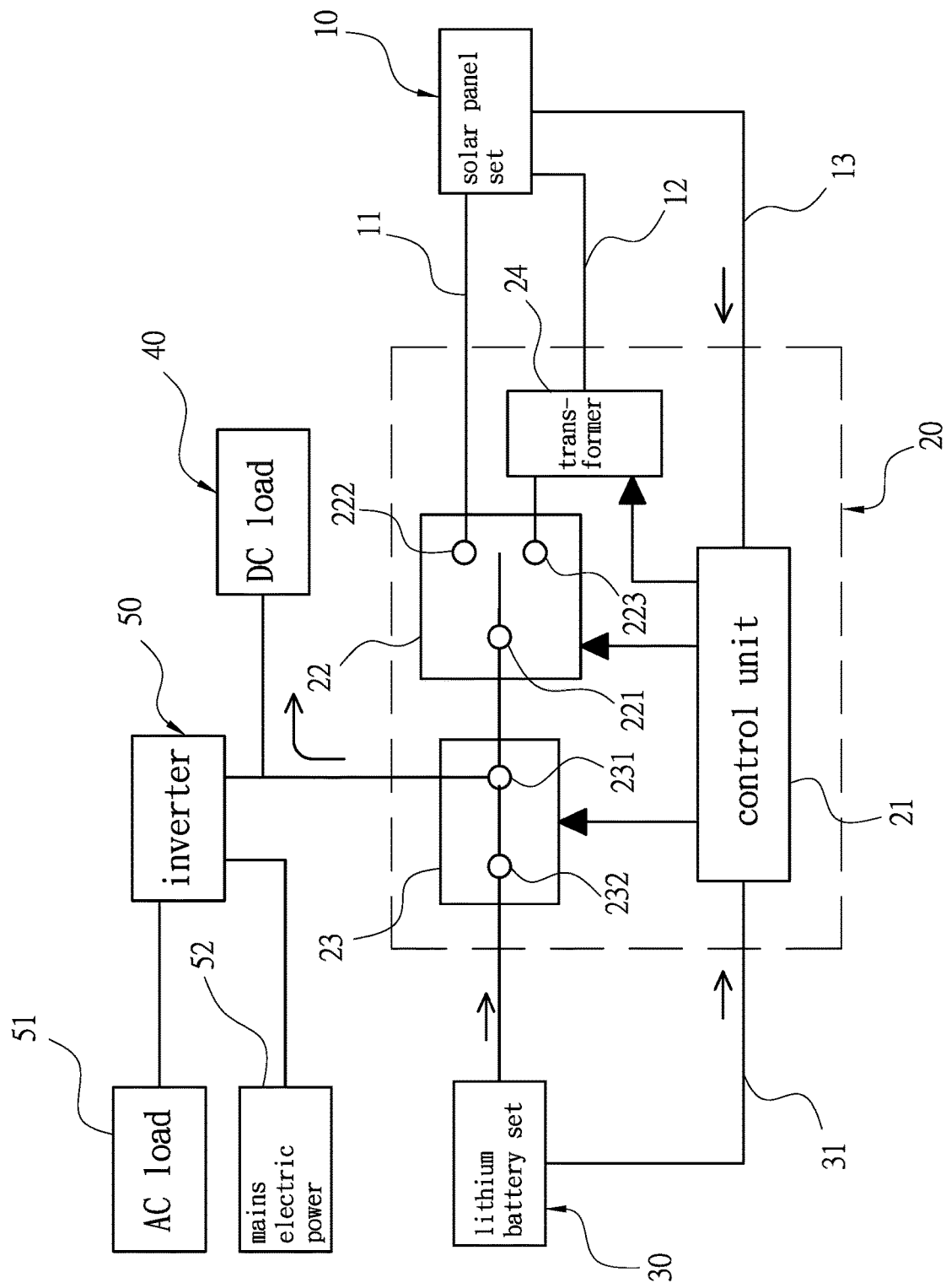
FIG. 4 is a flow block diagram of the solar power system of the present invention under the high-potential protection mechanism.

The solar power system of the present invention comprises the high-potential protection mechanism when the lithium battery set (30) is overcharged. Referring to FIG. 4, the control unit (21) of the controller (20) is configured to monitor the actual voltage of the lithium battery set (30) through the monitoring circuit (31). The lithium battery set (30) is determined as under overcharged condition when the actual voltage thereof is higher than 115% of the rated voltage. At this time, neither the first contact (222) nor the second contact (223) of the double-contact relay (22) is electrically connected to the main contact (221), and the lithium battery set (30) directly provides power to the DC load (40). Furthermore, when the solar power system of the present invention is also connected to the AC load (51), the direct current from the lithium battery set (30) is adapted to convert to the alternating current through the inverter (50) so as to provide power to the AC load (51) simultaneously. Moreover, the high-potential protection mechanism of the lithium battery set (30) is activated when neither the first contact (222) nor the second contact (223) of the double-contact relay (22) is electrically connected to the main contact (221). At this moment, the actual voltages of the solar panel set (10) and the lithium battery set (30) are respectively inputted to the control unit (21) through the control circuit (13) and the monitoring circuit (31), and the controller (20) is configured to determine whether the main contact (221) of the double-contact relay (22) is electrically connected to the first contact (222) or the second contact (223) according to the actual voltage of the solar panel set (10). Additionally, the controller (20) is adapted to awake the double-contact relay (22) and remove the high-potential protection mechanism when the actual voltage of the lithium battery set (30) is higher than 115% of the rated voltage over. Also, the solar power system can be set through the controller (20) that, under the high-potential protection status, the control unit (21) is configured to enable the second contact (223) to electrically connect to the main contact (221) every thirty minutes so as to enable the lithium battery set (30) to awake the double-contact relay (22) when not under overcharged condition, thereby preventing the lithium battery set (30) from keeping under the high-potential protection status due to miscalculation of the control unit (21). Furthermore, the solar panel set (10) has a greater chance of power generation at the high illumination condition when the lithium battery set (30) is under overcharged condition such that the control unit (21) is configured to switch the electrical connection between the second contact (223) to the main contact (221) to the electrical connection between the first contact (222) to the main contact (221) when determining the solar power system is at the low illumination condition.

Figure 5:
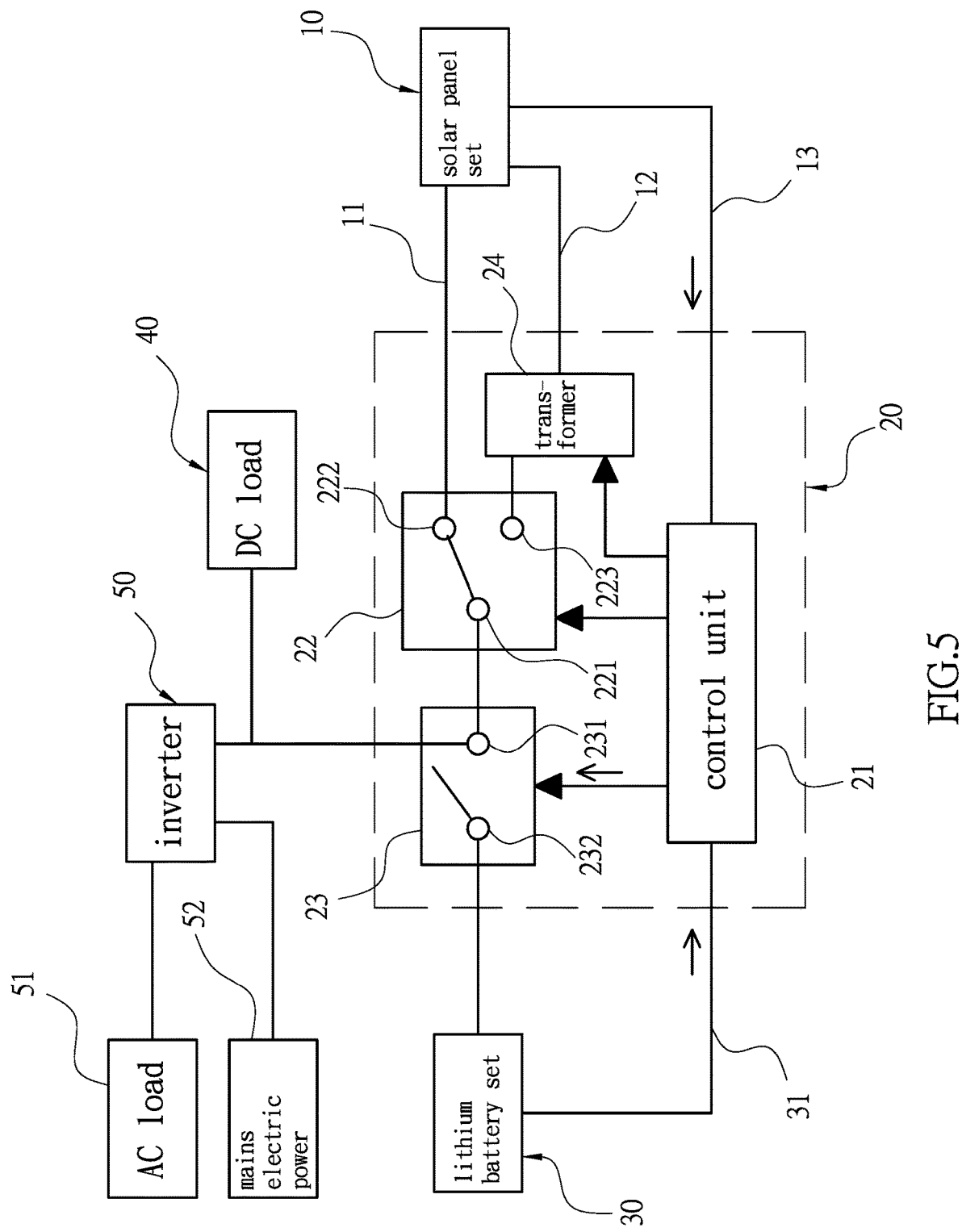
FIG. 5 is a flow block diagram of the solar power system of the present invention under the low-potential protection mechanism.

Moreover, the solar power system of the present invention also has the low-potential protection mechanism when the lithium battery set (30) is over-discharged. Referring to FIG. 5, the control unit (21) of the controller (20) is configured to monitor the actual voltage of the lithium battery set (30) through the monitoring circuit (31). The lithium battery set (30) is determined as under over-discharged condition when the actual voltage thereof is lower than 96% of the rated voltage. At this moment, the third contact (231) of the single-contact relay (23) is electrically disconnected to the fourth contact (232) thereof so as to activate the low-potential protection mechanism for the lithium battery set (30). At this time, the actual voltages of the solar panel set (10) and the lithium battery set (30) are respectively inputted to the control unit (21) through the control circuit (13) and the monitoring circuit (31), and the controller (20) is configured to determine whether the main contact (221) of the double-contact relay (22) is electrically connected to the first contact (222) or the second contact (223) according to the actual voltage of the solar panel set (10). Additionally, the controller (20) is adapted to awake the single-contact relay (23) and remove the low-potential protection mechanism when the actual voltage of the lithium battery set (30) is lower than 96% of the rated voltage. When the lithium battery set (30) is under the low-potential protection status, the main contact (221) of the double-contact relay (22) is electrically connected to the first contact (222) thereof, and the solar panel set (10) monitored by the control unit (21) is configured to execute the low illumination power generation. Meanwhile, the control unit (21) is adapted to electrically connect the third contact (231) to the fourth contact (232) of the single-contact relay (23) so as to enable the single-contact relay (23) to be awaked at the low illumination condition, thereby directly charging the lithium battery set (30). Since the solar panel set (10) is configured to directly and low-loss charge the lithium battery set (30) under the low illumination condition, the minimum effective generation voltage of the solar panel set (10) is increased so as to achieve a small amount of charging for the lithium battery set (30) and awake the single-contact relay (23) under the low illumination condition. Also, the solar panel set (10) has a greater change of power generation at the low illumination condition when the lithium battery set (30) is under over-discharged condition such that the control unit (21) is configured to switch the electrical connection between the first contact (222) to the main contact (221) to the electrical connection between the second contact (223) to the main contact (221) when determining the solar power system is at the high illumination condition.

In actual application, referring to FIGS. 2 to 5, the rated voltage of the lithium battery set (30) is 48V, and the solar panel set (10) comprises four 54.7V solar panels electrically connected in parallel to form 60V of rated voltage (under condition of no load voltage). The rated voltage of the solar panel set (10) is set between 115% and 130% of the rated voltage of the lithium battery set (30). The controller (20) can be directly programed that the actual voltage of the lithium battery set (30) is or over 55.2V as overcharged condition, i.e., the actual voltage of the lithium battery set (30) is higher than 115% of the rated voltage thereof, and the solar power system is configured to enter high-potential protection status under overcharged condition. Also, the controller (20) can be directly programmed that the actual voltage of the lithium battery set (30) is or lower than 46.1V as over-discharged condition, i.e., the actual voltage of the lithium battery set (30) is lower than 96% of the rated voltage thereof, and the solar power system is configured to enter low-potential protection status under dis-overcharge condition. Therefore, the single-contact relay (23) is monitored and controlled for been cut or awaked under the over-charged or over-discharged conditions. On the other hand, the controller (20) can be directly programed that the actual voltage of the solar panel set (10) is 55.2V as the condition of switching between direct charging and voltage regulating charging, i.e., the actual voltage of the solar panel set (10) is over or is not over 115% of the rated voltage of the lithium battery set (30). When the actual voltage outputted from the directly-charging circuit (11) of the solar panel set (10) is between 46.1V and 55.2V, the control unit (21) is adapted to electrically connect the main contact (221) of the double-contact relay (22) to the first contact (222) thereof so as to slowly charge the lithium battery set (30) under low illumination condition. When the actual voltage outputted from the regulating charging circuit (12) of the solar panel set (10) is between 55.2V and 60V, the control unit (21) is configured to electrically connect the main contact (221) of the double-contact relay (22) to the second contact (223) thereof so as to conduct voltage regulating charging under high illustration condition. Moreover, the controller (20) is configured to directly electrically connect to corresponding specifications of the solar panel set (10) and the lithium battery set (30) and is directly programmed with overcharging and over-discharging conditions so as to achieve the low-potential protection mechanism of the single-contact relay (23). Furthermore, the controller (20) is adapted to directly switch the conditions between the direct charging and voltage regulating charging so as to achieve high-potential protection mechanism of the double-contact relay (22) such that a user has no need to manually set the control value of the solar power system according to the environment and overcharging situation, which has advantages on simply structure, easy assembly, and low cost.

Having described the invention by the description and illustrations above, it should be understood that these are exemplary of the invention and are not to be considered as limiting. Accordingly, the invention is not to be considered as limited by the foregoing description, but includes any equivalents.

What is claimed is:

1. A solar power system comprising,
    a solar panel set electrically connected to a directly-charging circuit, a regulating charging circuit, and a control circuit;
    a controller having a control unit built therein to control a double-contact relay, a single-contact relay, and a transformer; the double-contact relay comprising a main contact, a first contact, and a second contact, and the main contact being switchable to electrically connect to the first contact or the second contact; the directly-charging circuit electrically connected to the first contact, and the regulating charging circuit electrically connected to the second contact through the transformer; the control circuit electrically connected to the control unit, and the single-contact relay electrically connected to a third contact and a fourth contact under normal use condition; the third contact electrically connected to the main contact of the double-contact relay;
    a lithium battery set electrically connected to the fourth contact of the single-contact relay and electrically connected to the control unit through a monitoring circuit;
    at least a DC load electrically connected to the third contact of the single-contact circuit; and
    wherein the rated voltage of the solar panel set is higher than the rated voltage of the lithium battery set between 15% and 30%, and the actual voltages of the solar panel set and the lithium battery set are measured through the control unit; when the actual voltage of the solar panel set is lower than 115% of the rated voltage of the lithium battery set, the main contact of the double-contact relay is electrically connected to the first contact, and the directly-charging circuit of the solar panel set is configured to directly and low-loss charge the lithium battery set under the low illumination condition; when the actual voltage of the solar panel set is higher than 115% of the rated voltage of the lithium battery set, the main contact of the double-contact relay is electrically connected to the second contact, and the solar panel set under the high illumination condition is adapted to have voltage-drop through the transformer and directly and high-efficiently charge the lithium battery set.

2. The solar power system of claim 1, wherein an inverter, which is electrically connected to the third contact of the single-contact relay, is adapted to convert direct current (DC) from the lithium battery set to alternating current (AC), and the inverter is electrically connected to at least an AC load, and the lithium battery set is adapted to provide alternating current to the AC load.

3. The solar power system of claim 2, wherein the inverter is electrically connected to a mains electric power; when the main contact of the double-contact relay is not electrically connected to the first contact or the second contact, the mains electric power is configured to have voltage regulation and directly charge the lithium battery set.

4. The solar power system of claim 1, wherein the control unit of the controller is configured to monitor the actual voltage of the lithium battery set through the monitoring circuit; the lithium battery set is determined as under overcharged condition when the actual voltage thereof is higher than 115% of the rated voltage, wherein, under overcharged condition, the main contact of the double-contact relay is not electrically connect to the first contact or the second contact, and the lithium battery set is configured to directly provide power to the DC load.

5. The solar power system of claim 4, wherein high-potential protection mechanism of the lithium battery set is activated when the main contact of the double-contact relay is not electrically connect to the first contact or the second contact, and the solar power system is set through the controller and the control circuit that, under the high-potential protection status, the control unit is configured to electrically connect the second contact to the main contact every thirty minutes so as to enable the lithium battery set to awake the double-contact relay when the lithium battery set is not under overcharged condition.

6. The solar power system of claim 1, wherein the control unit of the controller is configured to monitor the actual voltage of the lithium battery set through the monitoring circuit; the lithium battery set is determined as under over-discharged condition when the actual voltage thereof is lower than 96% of the rated voltage, and the third contact of the single-contact relay is electrically disconnected to the fourth contact thereof so as to activate the low-potential protection mechanism for the lithium battery set.

7. The solar power system of claim 6, wherein when the lithium battery set is under the low-potential protection status, the main contact of the double-contact relay is electrically connected to the first contact thereof, and the solar panel set monitored by the control unit is configured to execute the low illumination power generation; the control unit is adapted to electrically connect the third contact to the fourth contact of the single-contact relay so as to enable the single-contact relay to be awaked at the low illumination condition, thereby directly charging the lithium battery set.

8. The solar power system of claim 1, wherein the rated voltage of the lithium battery set is 48V, and the solar panel set comprises four 54.7V solar panels electrically connected in parallel to form 60V of rated voltage, and the actual voltage outputted from the directly-charging circuit of the solar panel set is between 46.1V and 55.2V while the actual voltage outputted from the regulating charging circuit of the solar panel set is between 55.2V and 60V.

* * * * *